United States Patent
Huang et al.

(10) Patent No.: US 6,615,210 B1
(45) Date of Patent: Sep. 2, 2003

(54) BIT STREAM TERNARY MATCH SCHEME

(75) Inventors: Nen-fu Huang, Hsinchu (TW); Shi-ming Zhao, Taipei (TW)

(73) Assignee: Broad Web Corporation, HsinChu (TW)

( * ) Notice: Subject to any disclaimer, the term of this patent is extended or adjusted under 35 U.S.C. 154(b) by 0 days.

(21) Appl. No.: 09/498,096

(22) Filed: Feb. 4, 2000

(51) Int. Cl.[7] ............................. G06F 17/30; G06F 7/00
(52) U.S. Cl. ............................................. 707/6; 365/49
(58) Field of Search ................................ 365/49; 707/6

(56) References Cited

U.S. PATENT DOCUMENTS

| | | | |
|---|---|---|---|
| 4,996,666 A | * 2/1991 | Duluk, Jr. | 365/49 |
| 5,010,516 A | * 4/1991 | Oates | 365/49 |
| 5,173,695 A | * 12/1992 | Sun et al. | 341/67 |
| 5,245,338 A | * 9/1993 | Sun | 341/67 |
| 5,319,590 A | * 6/1994 | Montoye | 365/49 |
| 5,422,838 A | * 6/1995 | Lin | 365/49 |
| 5,440,715 A | * 8/1995 | Wyland | 711/108 |
| 5,448,733 A | * 9/1995 | Satoh et al. | 707/2 |
| 5,602,764 A | * 2/1997 | Eskandari-Gharnin et al. | 708/210 |
| 5,765,209 A | * 6/1998 | Yetter | 711/207 |
| 5,920,886 A | * 7/1999 | Feldmeier | 711/108 |
| 5,949,696 A | * 9/1999 | Threewitt | 365/49 |
| 6,108,227 A | * 8/2000 | Voelkel | 365/49 |
| 6,154,384 A | * 11/2000 | Nataraj et al. | 365/49 |
| 6,240,000 B1 | * 5/2001 | Sywyk et al. | 365/49 |
| 6,243,280 B1 | * 6/2001 | Wong et al. | 365/49 |

(List continued on next page.)

OTHER PUBLICATIONS

Yamada, H. et al. "A High–Speed String–Search Engine", IEEE Journal of Solid–State Circuits, vol. SC–22, No. 5, pp. 829–834, Oct. 1987.*

McAuley, A.J. and Francis, P. "Fast Routing Table Lookup Using CAM's", Proceedings of the 12th Joint Conference of the IEEE Computer and Communication Societies (INFOCOM '93). Mar. 28–Apr. 1, 1993, pp. 1382–1391 vol. 3.*

Ramirez–Chavez, S.R. "Encoding Son't Cares in Statis and Dynamic Content–Addressable Memories", IEEE Transactions on Circuits and Systems–II: Analog and Digital Signal Processing, vol. 39, No. 8, Aug. 1992, pp. 575–578.*

McAuley, A.J. and Francis, P. "Fast Routing Table Lookup Using CAMs", Proceedings of the 12th Annual Joint Conference of the IEEE Computer and Communications Societies INFOCOM '93, Mar. 28–Apr. 1, 1993, vol. 3, pp. 1382–1391.*

Ramirez–Chavez, S.R. "Encoding Don't Cares in Static and Dynamic Content–Addressable Memories", IEEE Transactions on Circuits and Systems–II: Analog and Digital Signal Processing, vol. 39, No. 8, Aug. 1992, pp. 575–578.*

Wade, J.P. and Sodini, C.G. "A Ternary Content Addressable Search Engine", IEEE Journal of Solid–State Circuits, vol. 24, No. 4, Aug. 1989, pp. 1003–1013.*

* cited by examiner

Primary Examiner—Jean R. Homere
Assistant Examiner—Luke S Wassum
(74) Attorney, Agent, or Firm—Birch, Stewart, Kolasch & Birch, LLP

(57) ABSTRACT

The method for providing a "Don't Care" bit to improve the speed of information matching in a digital information processing system. After the match information is input, it will be divided into multiple sub-bit-streams and then input to a correspondent selector for obtaining the content of a selected memory bank. The output of each selector is forwarded to the product module to compute an unencoded match result. Finally, the priority encoder receives the unencoded match result and performs priority encoding to generate an encoded match result and a match flag. If the match flag is positive, it indicates that there is a hit in the rule table for the match information. Thus, the match result serves as an index for looking up an information table.

9 Claims, 14 Drawing Sheets

U.S. PATENT DOCUMENTS

| | | | |
|---|---|---|---|
| 6,249,467 B1 * | 6/2001 | Pereira et al. | 365/200 |
| 6,252,790 B1 * | 6/2001 | Shectman | 365/49 |
| 6,259,620 B1 * | 7/2001 | Kling et al. | 365/49 |
| 6,289,414 B1 * | 9/2001 | Feldmeier et al. | 711/108 |
| 6,317,350 B1 * | 11/2001 | Pereira et al. | 365/49 |
| 6,324,087 B1 * | 11/2001 | Pereira | 365/49 |
| 6,362,992 B1 * | 3/2002 | Cheng | 365/49 |
| 6,374,326 B1 * | 4/2002 | Kansal et al. | 711/108 |
| 6,515,884 B1 * | 2/2003 | Sywyk et al. | 365/49 |

* cited by examiner

0 → Only matched by 0.
1 → Only matched by 1.
X → Don't Care, matched by 0 or 1.

| T.Bit S. | Bit 3 | Bit 2 | Bit 1 | Bit 0 |
|---|---|---|---|---|
| 00 | 0 | 0 | 0 | 1 |
| 01 | 0 | 0 | 1 | 0 |
| 10 | 0 | 1 | 0 | 0 |
| 11 | 1 | 0 | 0 | 0 |
| 0X | 0 | 0 | 1 | 1 |
| 1X | 1 | 1 | 0 | 0 |
| X0 | 0 | 1 | 0 | 1 |
| X1 | 1 | 0 | 1 | 0 |
| XX | 1 | 1 | 1 | 1 |

BIT STREAM TERNARY MATCH SCHEME

BACKGROUND OF THE INVENTION

A. Field of the Invention

The present invention relates to an information match scheme and apparatus capable of providing Don't Care Bits for searching information in a digital information system, especially to a bit-stream ternary match scheme and apparatus capable of flexibly adjusting the design parameters according to the concern of cost, performance and power consumption.

B. Description of the Prior Art

The technology of digital information search has been widely applied in the area which requires large data storage and processing. The search speed and its correctness depend on the algorithm applied. The vigorous growth of Internet services and applications has made the search mechanism in large search pool and database systems more demanding. Apparently, the conventional exact match has been insufficient for such purposes. For the new search environment and applications, the technology of ternary match scheme has become the choice for the digital information search of next generation. Currently, the bit-stream ternary match scheme technology can be widely applied in the area, such as IP routing, packet flow classification, packet content-sensitive flow classification, and security system.

The difference between the ternary match scheme and the conventional exact match scheme is that it provides an additional "Don't Care bit" for the bit matching in addition to "0" and "1". The "Don't Care Bit" is immune to the match results of "0" or "1". With reference to FIG. 1, in a ternary bit-stream 11, each bit can be "1", "1" or "X", which respectively represent the bit value matches with "0", "1" or "X" (either of them). In practical application, the value of two bits can be represented by one bit, i.e., 00→0, 01→1, 10→X or 11→X.

In general, the bit-stream ternary match scheme can be illustrated in FIG. 2 which includes: a rule table 21 hand an information table 22. The procedure of the match scheme is as follows: first, input a match information 23 consisting of a bit-stream. Then, perform a ternary match between the match information 23 and the entries of the rule table 21. Finally, determine if there is a hit according to the match result. If not, it indicates that there is no hit in the rule table 21. If yes, use the sequence number of the rule (rule ID) matched in the rule table 21 as an index to lookup the information table 22.

Refer to FIG. 3 for showing the format of the rule table 21. Each rule table 21 contains multiple rules. And each rule consists of a ternary bit-stream. The size of the rule table 21 is defined according to the maximum allowable length of the rules (W-bit) and the maximum number of rules (L). Each rule has a piece of correspondent information stored in the information table 22. The sequence of each piece of information in the information table 22 is correspondent to the sequence of the rules in the rule table 21. In that case, the number of the pieces of information stored in the information table 22 is also L. The sequence of the rules in the rule table 21 is arranged according to its priority order. The priority decreases as the rule ID number increases. For this reason, when there are more than two rules matched with the information in the information table 21, the rule ID with the highest priority will be selected.

However, the bottleneck for the current bit-stream ternary match scheme is that it cannot flexibly adjust the design parameters and search speed according to the concern of cost. Consequently, the cost/performance issue for implementing the bit-stream ternary match scheme and increasing the search speed is very high for large search spool and database systems.

SUMMARY OF THE INVENTION

Accordingly, it is an object of the present invention to provide a method and apparatus for bit-stream ternary match scheme with design flexibility, thereby to speed up the search in constant time.

It is another object of the present information to provide a method and apparatus for bit-stream ternary match scheme which can flexibly adjust the design parameters according to the concern of cost, performance, and power consumption, thereby to meet the requirement of different needs.

Accordingly, it is an aspect of the present invention to provide an apparatus for bit-stream ternary match scheme. The apparatus of the invention includes: multiple memory tables and equal number of corresponding selectors, a product module, and a priority encoder. Each memory table includes multiple memory banks. After the match information is input to the ternary match module, it is divided into several sub-bit-streams. Then, each sub-bit-stream is input to a correspondent selector for obtaining the content of a selected memory bank. The content of the memory bank contains the bit-streams after pre-computation procedure. Then, the output of each selector is forwarded to the product module to compute an unencoded match result. Finally, the unencoded match result is forwarded to the priority encoder for generating the encoded match result and match flag. If the match flag is negative, it indicates that there is no match between the match information and the rule table. If the result is positive, the encoded match result serves as an index for looking up the information table.

In an aspect of the present invention, a method for bit-stream ternary match scheme is provided. The method includes the steps of: (a) Determine the space of a rule table according to a maximum allowable bit-length (W) of a rule, and the number of maximum allowable rules (L). (b) Divide the maximum allowable bit-length (W) into N+1 sub-bit-streams, where N is an integer. (c) Determine N+1 memory tables and N+1 selectors according to the number of sub-bit-streams of the step (b). (d) Determine the scale of each memory table and each selector according the bit-length of correspondent sub-bit-stream of the step (b). (e) Encode a plurality of rules according to a pre-computation procedure and generate a plurality of encoded entries. (f) Sequentially store the plurality of encoded entries in the rule table. (g) Send the output of each of the N+1 selectors into a product module to compute an unencoded match result in response to match information. (h) Forward the unencoded match result of the product module to a priority encoder to perform priority encoding and generate an encoded match result and a match flag. And (i) determine if there is a match information existed according to the match flag. When the match flag indicates a negative result, there is no match between said match information and the rule table. On the other hand, when the match flag indicates a positive result, the encoded match result acts as an index for searching the information table.

According to the concern of cost, performance and power consumption, the present invention can be more flexible to divide the execution steps into several stages following the pipeline technology. Thus, the design parameters can be flexibly adjusted. Eventually, the throughput can be efficiently improved, thereby to reduce the power consumption. Moreover, the present invention can largely reduce the search time into constant time and save the cost according to a desirable performance.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and advantages of the present invention will become apparent by reference to the following description and accompanying drawings, which are given by way of illustration only, and thus are not limitative of the present invention, and wherein.

DETAILED DESCRIPTION OF THE PREFERRED EMBODIMENTS

Figure 1:
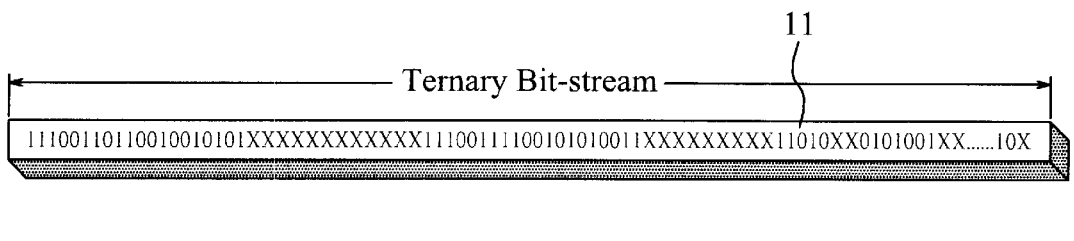
FIG. 1 is a schematic diagram showing a conventional ternary bit-stream.
Figure 2:
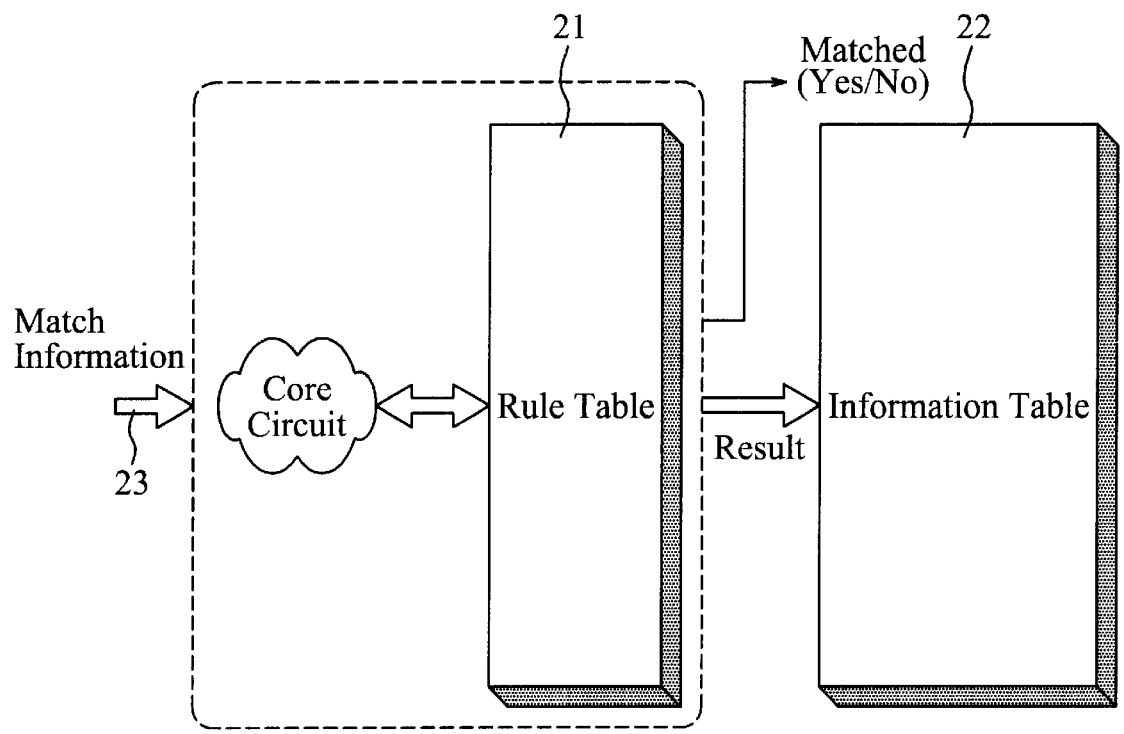
FIG. 2 is a schematic diagram showing the conventional bit-stream ternary match scheme.
Figure 3:
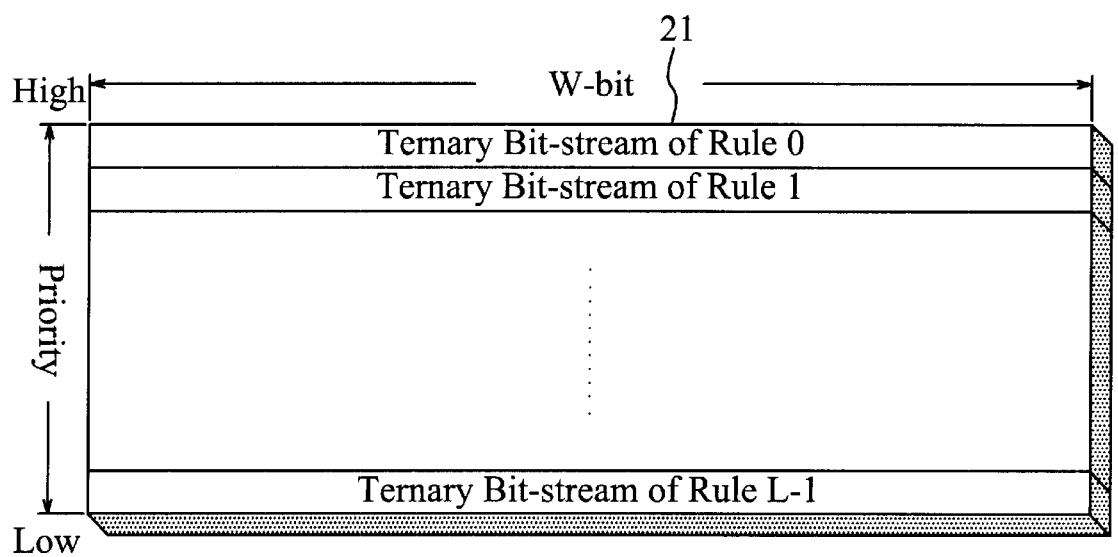
FIG. 3 is a schematic diagram showing the rule table of the bit-stream ternary match scheme.
Figures 4A, 4B:
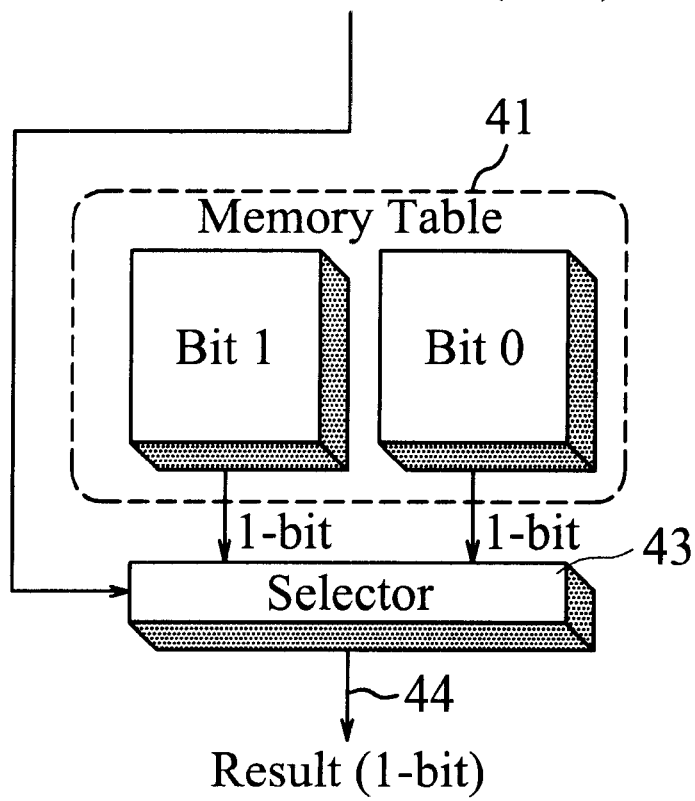
FIG. 4A is a schematic diagram showing the 1-rule×1-bit bit-stream ternary match scheme according to a preferred embodiment of the present invention.
FIG. 4B is a schematic diagram showing the transformation table of the embodiment illustrated in FIG. 4A for converting the rules into the rule table.

Refer to FIG. 4A for the illustration of the method of the invention. The simplified ternary match scheme is based on a 1-bit rule for easy to understand. To store the 1-bit rule in the memory table 41, the 1-bit rule must be pre-computed and then converted into a format adaptable for the memory table 41.

With reference to FIG. 4B, a bit can represent the values of either 0 or 1 or X (Don't care). Accordingly, the transformation table 42 can convert a ternary bit-stream of 1-bit into a bit-stream of 2-bit. The Bit-1 and Bit-0 of the resultant bit-stream will be stored in the locations of the memory table 41 corresponding to the position of Bit-1 and Bit-0. Thus, the 1-bit rule has been stored in the memory table 41 for the purpose of ternary match. When inputting a piece of match information, the bit-stream of the match information will control the selector 43 to select output data from the memory table 42 and generate a match result 44 represented by Bit-1 or Bit-0.

To illustrate the operations of the ternary match scheme in FIG. 4 more clearly, refer to the following examples:

1. A rule for matching the value of "0":
   (1) store a rule:
      To match the value of 0, the rule with the content of "0" must be stored. The bit-stream of "01" can be obtained via the transformation table 42 as illustrated in FIG. 4B. The "0" and "1" of the bit-stream "01" are stored in the Bit-1 and Bit-0 positions of the memory table 41 corresponding to the positions of bit-1 and bit-0, respectively. After that, the rule for matching the value of 0 has successfully stored in the memory table 41.
   (2) Perform ternary bit-stream matching:
      When the bit-stream is 0, the selector 43 will output the value of Bit-0. According to the previously determined rule, the match result will be "1". Thus, the bit-stream of "0" has a hit in the information table.
      On the other hand, when the bit-stream is 1, the selector 43 will select Bit-1 and output the value of Bit-1 as a match result. According to the previously determined rule, the match result will be "0". Thus, it indicates that there is no hit for the bit-stream of "1" in the information table.

2. A rule for matching the value of "1":
   (1) store a rule:
      To match a value of 1, the rule with the content of "1" must be stored. The bit-stream of "10" can be obtained via the transformation table 42 as illustrated in FIG. 4B. The "1" and "0" of the bit-stream "10" are stored in the Bit-1 and Bit-0 positions of the memory table 41 corresponding to the positions of bit-1 and bit-0, respectively. After that, the rule for matching the value of 1 has successfully stored in the memory table 41.
   (2) Perform ternary bit-stream matching:
      When the bit-stream is 0, the selector 43 will output the value of Bit-0. According to the previously determined rule, the match result will be "0". Thus, the bit-stream of "0" has no hit in the information table.
      On the other hand, when the bit-stream is 1, the selector 43 will select Bit-1 and output the value of Bit-1 as a match result. According to the previously determined rule, the match result will be "1". Thus, it indicates that there is a hit for the bit-stream of "1" in the information table.

3. A rule for matching the value of "X":

(1) Store a rule:

To match a value of X, the rule with the content of "X" must be stored. The bit-stream of "11" can be obtained via the transformation table 42 as in the Bit-1 and Bit-0 positions of the memory table 41 corresponding to the positions of bit-1 and bit-0, respectively. After that, the rule for matching the value of X has successfully stored in the memory table 41.

(2) Perform ternary bit-stream matching:

When the bit-stream is 0, the selector 43 will output the value of Bit-0. According to the previously determined rule, the match result will be "1". Thus, the bit-stream of "0" has a hit in the information table.

On the other hand, when the bit-stream is 1, the selector 43 will select Bit-1 and output the value of Bit-1 as a match result. According to the previously determined rule, the match result will be "1". Thus, it indicates that there is a hit for the bit-stream of "1" in the information table.

From the explanation stated above, it can show that the design of the ternary match scheme as illustrated in FIG. 4A is correct.

Figure 4C:
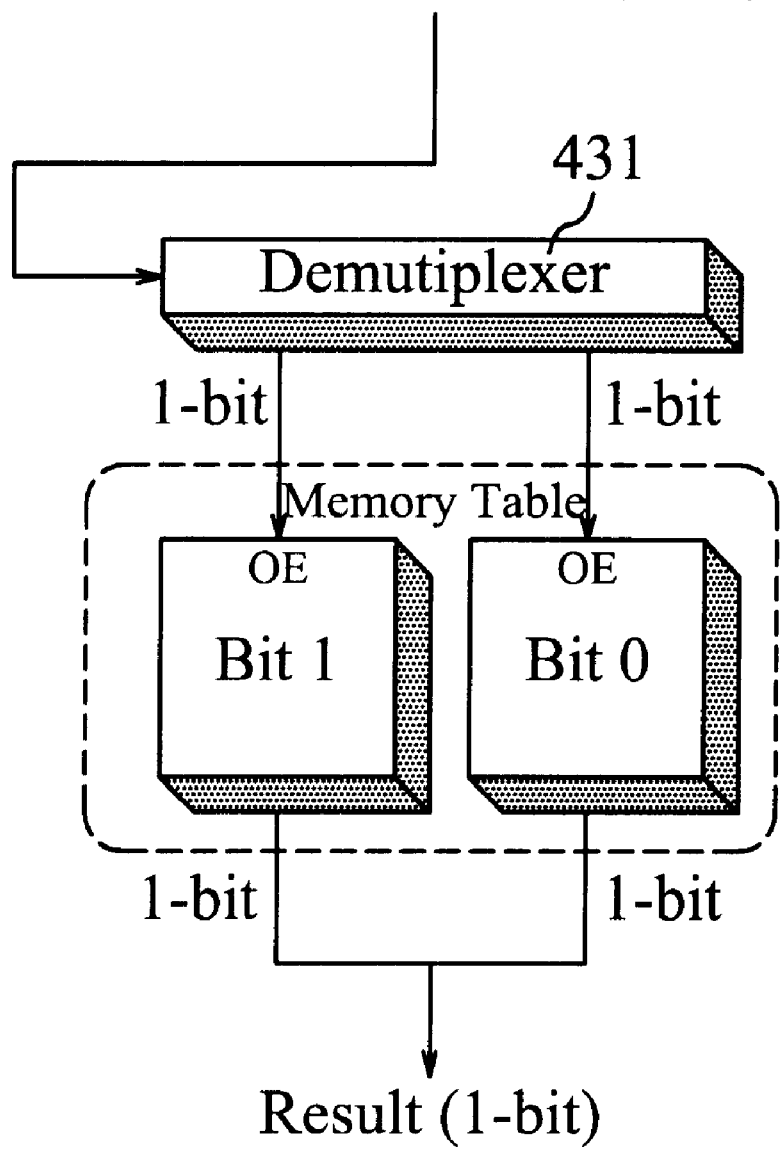
FIG. 4C is a schematic diagram showing the 1-rule×1-bit bit-stream ternary match scheme according to another preferred embodiment of the present invention.

The selector 43 of FIG. 4A can be implemented as a MUX. In application as FIG. 4C shows, it can also be replaced with a DeMUX and operated directly in response to the match information to get the match result. The operations of the circuit are similar to that as illustrated in FIG. 4A. However, for the purpose of illustration, the embodiment of FIG. 4A is more simple and straightforward.

Figures 5A, 5B:
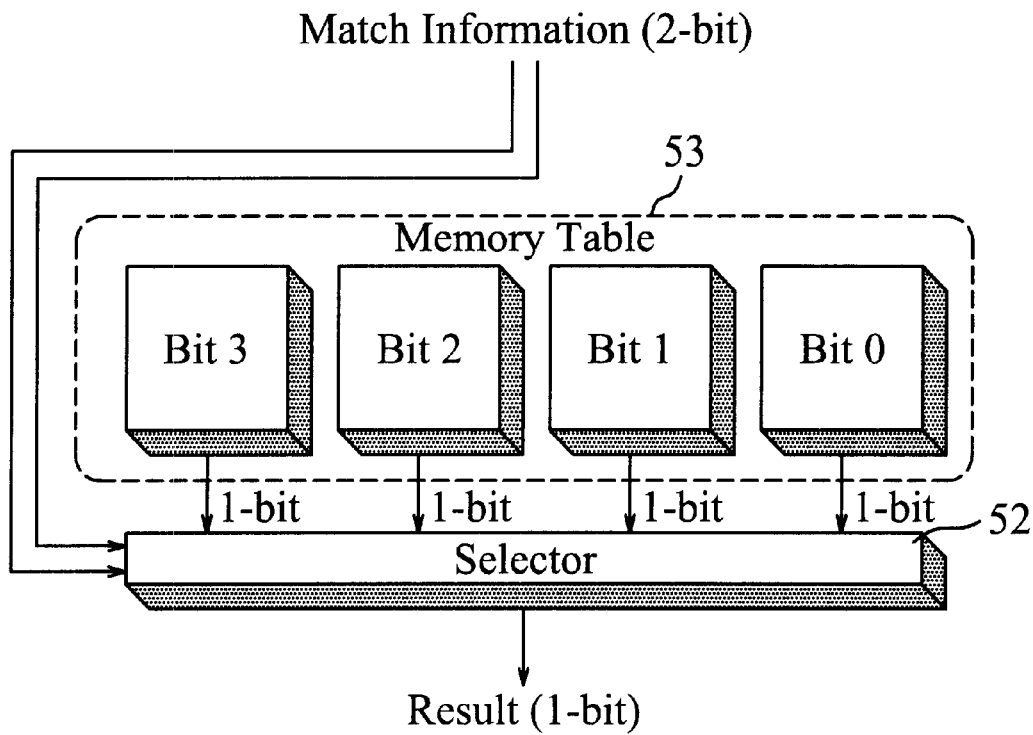
FIG. 5A is a schematic diagram showing the 1-rule×2-bit bit-stream ternary match scheme according to another preferred embodiment of the present invention.
FIG. 5B is a schematic diagram showing the transformation table of FIG. 5A for converting the rules into the rule table according to another preferred embodiment of the present invention.

The embodiment as illustrated in FIG. 4A and FIG. 4B can be extended to the ternary match scheme of a 2-bit rule as illustrated in FIG. 5A and the transformation table 51 of FIG. 5B. To explain the feature of the present invention in more details, the operations of FIG. 5A can be explained as follows:

1. A rule for matching the value of "00":

To match the value of 00, the rule with the content of "00" must be stored. The bit-stream of "0001" can be obtained via the transformation table 51 as illustrated in FIG. 5B. The bit-stream consisting of "0", "0", "0", and "1" are stored in the positions of Bit-3, Bit-2, Bit-1, and Bit-0 of the memory table 53, respectively. Thus, the rule for matching the value of "00" has been successfully stored in the memory table 53.

(2) Perform ternary bit-stream matching:

When the bit-stream is 00, the selector 52 will output the value of Bit-0. According to the previously determined rule, the match result will be "1". Thus, the bit-stream "00" has a hit in the information table.

When the bit-stream is 01, the selector 52 will select Bit-1 and output the value of Bit-1 as a match result. According to the previously determined rule, the match result will be "0". Thus, it indicates that there is no hit for the bit-stream of "01" in the information table.

On the other hand, when the bit-stream is 10, the selector 52 will select Bit-2 and output the value of Bit-2 as a match result. According to the previously determined rule, the match result will be "0". Thus, it indicates that there is no hit for the bit-stream "01" in the information table.

When the bit-stream is 11, the selector 52 will select Bit-3 and output the value of Bit-3 as a match result.

According to the previously determined rule, the match result will be "0". Thus, it indicates that there is no hit for the bit-stream of "11" in the information table.

2. A rule for matching the value of "01":

To match a value of 01, the rule with the content of "01" must be stored. The bit-stream of "0010" can be obtained via the transformation table 51 as illustrated in FIG. 5B. The bit-stream consisting of "0", "0", "1" and "0" is sequentially stored in the positions of Bit-3, Bit-2, Bit-1, and Bit-0 of the memory table 53, respectively. Thus, the rule for matching the value of "01" has successfully stored in the memory table 53.

(2) Perform ternary bit-stream matching:

When the bit-stream is 00, the selector 52 will output the value of Bit-0. According to the previously determined rule, the match result will be "0". Thus, the bit-stream of "00" has no hit in the information table.

When the bit-stream is 01, the selector 52 will select Bit-1 and output the value of Bit-1 as a match result. According to the previously determined rule, the match result will be "1". Thus, it indicates that there is a hit for the bit-stream of "01" in the information table.

On the other hand, when the bit-stream is 10, the selector 52 will select Bit-2 and output the value of Bit-2 as a match result. According to the previously determined rule, the match result will be "0". Thus, it indicates that there is no hit for the bit-stream of "10" in the information table.

When the bit-stream is 11, the selector 52 will select Bit-3 and output the value of Bit-3 as a match result. According to the previously determined rule, the match result will be "0". Thus, the bit-stream "11" still has no hit in the information table.

The other examples for performing matches of "10", "11", "0X", "1X", "X0", "X1", and "XX" are similar to the operations described above. It would be obvious for those skilled in the art without undue experiments.

Figure 6:
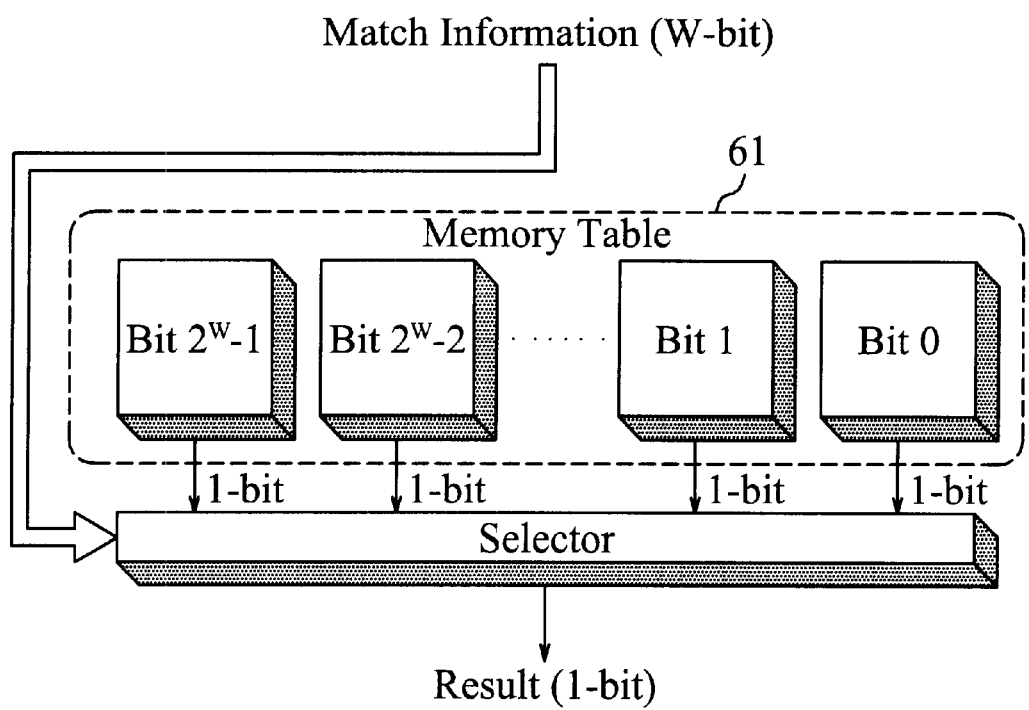
FIG. 6 is a schematic diagram showing the 1-rule×W-bit bit-stream ternary match scheme according to another preferred embodiment of the present invention.

The apparatus as explained above can be extended and generated to obtain the apparatus as illustrated in FIG. 6. The apparatus are designed following the 1-rule×W-bit ternary match scheme. However, according to the scheme of FIG. 6, the size of the memory table 61 required is two to the power of the bit-length of the rule. In other words, if the bit-length of the rule is W, the memory space required for the memory table 61 will be $2^W$-bit. The memory requirement is extremely large. Image that a rule with bit-length of 128 bits (W=128), the total memory space required for processing a rule will be $2^{128}$ bits. In that case, the implementation cost will be too expensive. To reduce the cost, the present invention divides the rule with the bit-length of W-bit into N+1 sub-bit-streams. The bit-length for the ith stage is $M_i$-bit and W=$\Sigma M_i$ and $0 \leq i \leq N$, $1 \leq M_i \leq W$. Accordingly, process each 1-rule×$M_i$-bit sub-stream using the above-mentioned ternary match scheme. Finally, output the result of each sub-stream into a product module to obtain the rule with the length of W-bit as the ternary match scheme.

Figure 7:
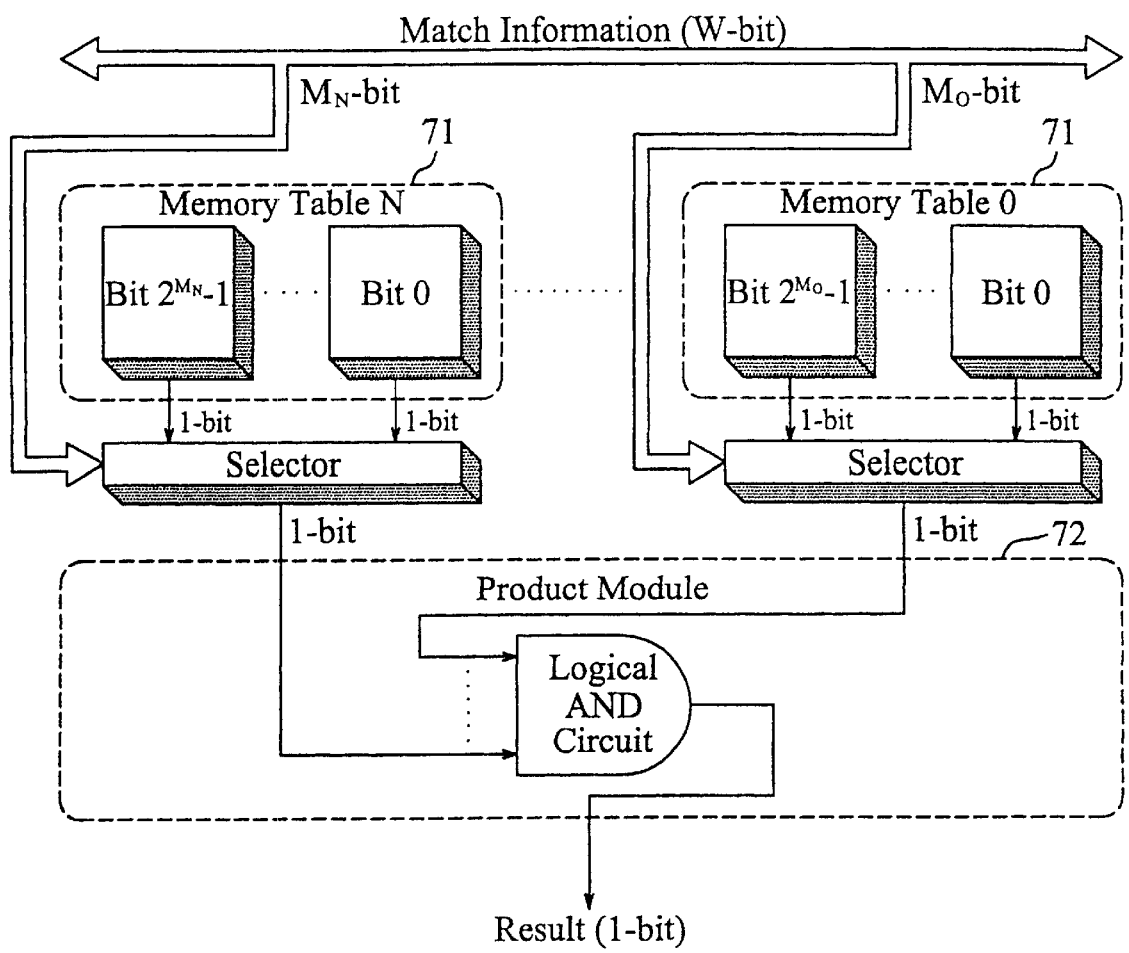
FIG. 7 is a schematic diagram showing the simplified 1-rule×W-bit ternary match scheme according to another preferred embodiment of the present invention for the concern of cost and performance.

Refer to FIG. 7 for showing the 1-Rule×W-bit ternary match scheme according to another embodiment of the present invention to reduce the cost. The ternary bit-stream is divided into N+1 sub ternary bit-streams. Each sub ternary bit-stream is stored in a correspondent position in the memory table 71. The required memory space for the memory table is reduced to $$\sum_{i=N}^{0} 2^{M_i}$$

bits For instance, let W=128, N+1=128, $M_N=M_{N-1}=\ldots=M_1=M_0=1$. In that case, the memory required will be 256 bits which is far smaller than the size of $2^{128}$ bits. Of course, the speed of such design will be slightly slower than the previous one. The speed depends on the number of sub-bit-streams divided. The number of bits required in the product module 72 increases as the number of sub-bit-streams increases. For this reason, the performance of the circuit is in reverse proportional to the number of sub ternary bit-streams. The value of each $M_i$ is therefore determined according to the concern of cost.

Figure 8:
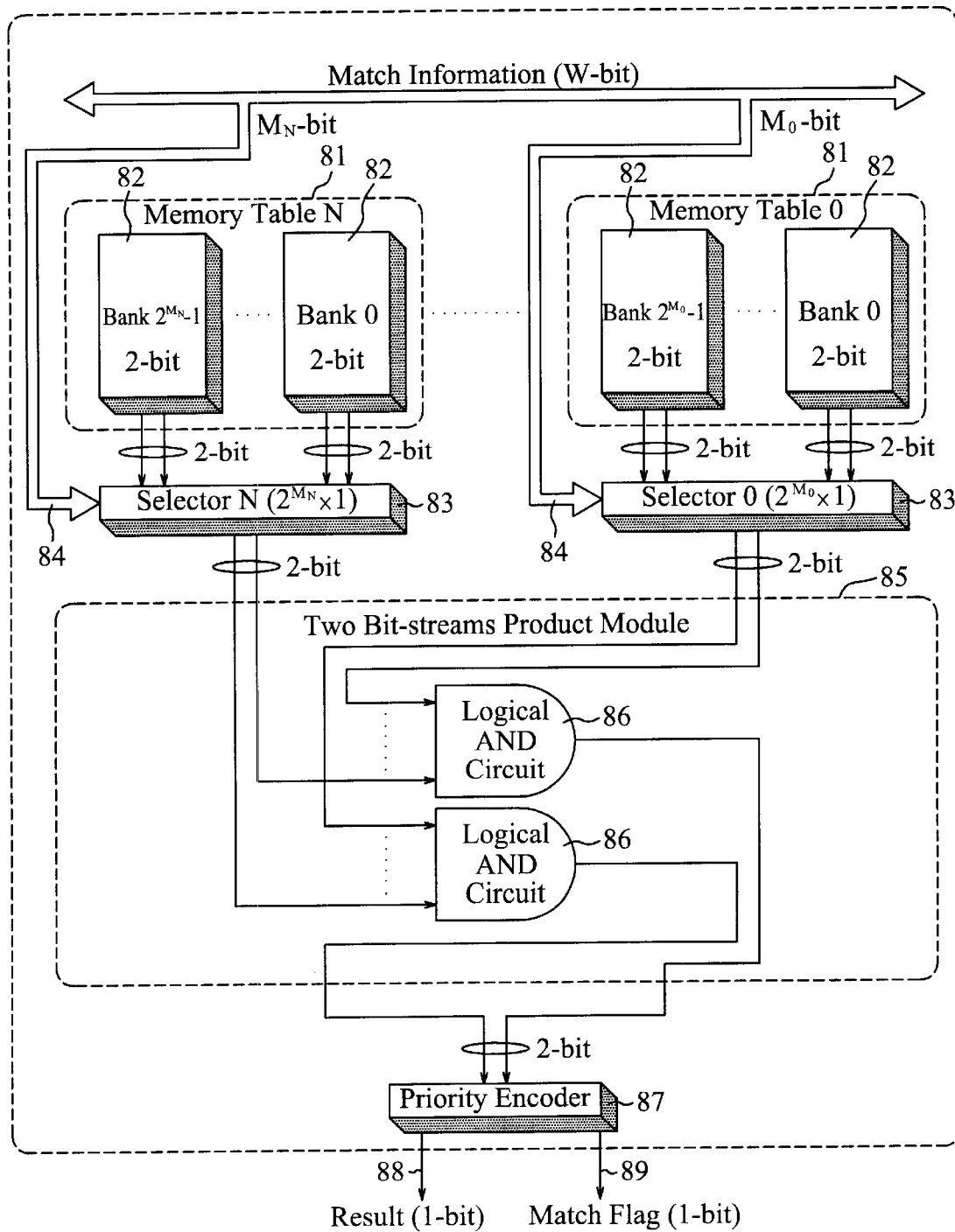
FIG. 8 is a schematic diagram showing the 2-rule×W-bit bit-stream ternary match scheme according to another preferred embodiment of the present invention.

To provide a total solution for the bit-stream ternary match scheme, the present invention can be further extended to provide a ternary match scheme of 2-rule×W-bit as illustrated in FIG. 8. With reference to FIG. 8, the apparatus for ternary match scheme can store two rules. Each bit of the memory table 81 has been extended in vertical direction to form a unit of two bits. The memory for storing the unit of two bits is then called a memory bank 82. The Bit-0 of each memory bank 82 forms a bit-stream for storing rule 0. The Bit-1 of each memory bank 82 forms a bit-stream for storing rule 1. Accordingly, the memory tables 81 can store two rules.

Each selector 83 is connected to its correspondent memory table 81. The match information 84 can select a memory bank 82 from each memory table 81. The selected memory bank 82 outputs the 2-bit bit-stream for forwarding to subsequent two bit-streams product module 85. The two bit-streams product module 85 includes two logical AND gate circuits 86 for computing the match results of rule 0 and rule 1. Accordingly, the invention can obtain the match result of the match information via the two bit-streams product module 85.

According to the rule of priority, if rule 0 and rule 1 are both matched, then the rule ranked with the higher priority should be selected. Moreover, since the match result is unencoded, thus the match result should be encoded and converted into a straightforward binary format by the priority encoder 87. However, it should be noticed that the match result may indicate no hit or even multiple hits. In that case, the priority encoder 87 must be able to distinguish these two situations and provide the match result with the highest priority for the match information. Thus, the priority encoder 87 provides a match flag 89 for indicating if there is any matched information existed. If the match flag 89 is negative, it indicates that there is no match. On the other hand, if the match flag 89 is positive, the priority encoder 87 will generate the encoded match result 88. Thus, the ternary match scheme as illustrated in FIG. 8 can successfully provide a solution for a bit-stream ternary match scheme of 2-rule×W-bit with reduced cost.

Figure 9A:
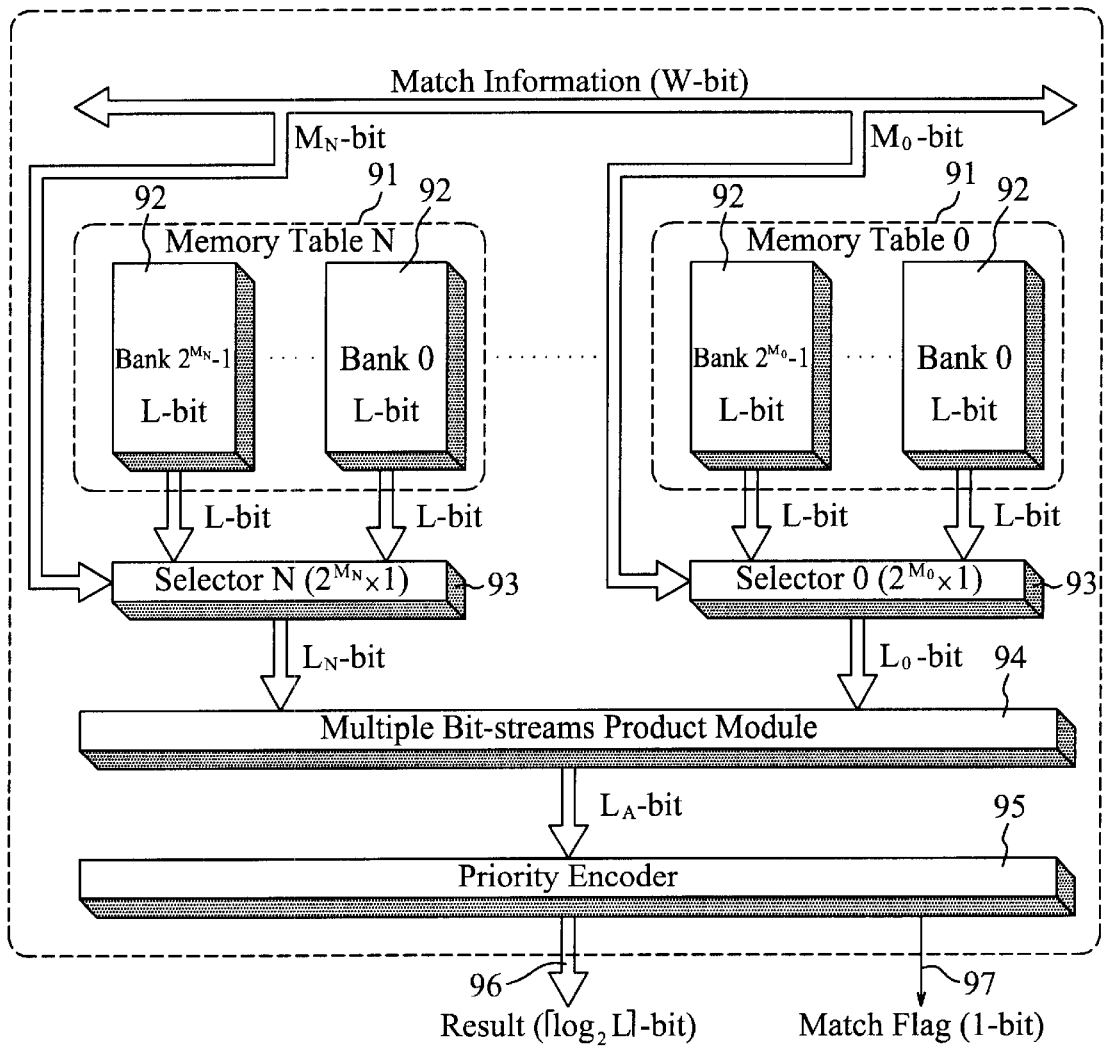
FIG. 9A is a schematic diagram showing the bit-stream ternary match scheme according to another preferred embodiment of the present invention.
Figure 9B:
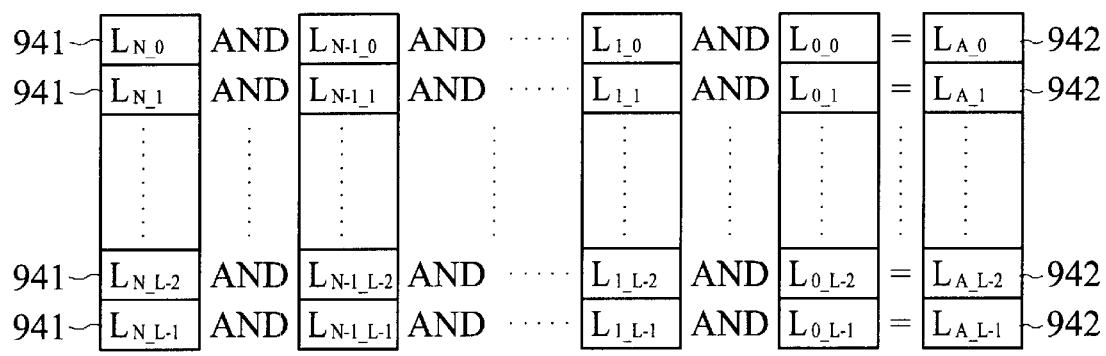
FIG. 9B is a schematic diagram showing the product module of the embodiment as illustrated in FIG. 9A.

Based on the approach as illustrated in FIG. 8, the present invention can provide a solution for storing multiple rules in the memory table as illustrated in FIG. 9A. The memory table 91 can store L rules. The bit-stream of each memory bank 92 in each memory table 91 are vertically expanded to L bits. The bit-stream consisting of jth-bit of each memory bank 92 is for storing the jth rule, $0 \leq j \leq L-1$. Consequently, the memory tables 91 can store L rules. Accordingly, the content of the memory bank 92 which stores the L-bit bit-stream can be found according to the match information and the selection of the selector 93 which connects to its correspondent memory table 91. Each L-bit bit-stream generated will be forwarded to the multiple bit-streams product module 94. Refer to FIG. 9B for showing the operations of the multiple bit-streams product module 94. It includes L product modules 941 (refer to FIG. 9B) for obtaining the match result 942 of each rule. The outputs of the multiple bit-streams product module 94 are also forwarded to a priority encoder 95 for encoding the matched information according to the priority levels. It should be noticed that the relationships among the output/input bit-length of each device must comply with the following equation: $L_0=\ldots=L_N=L_A=L$. Then, the priority encoder 95 outputs a match result 96 with bit-length of $\lceil \log_2 L \rceil$-bit and a match flag 97 of 1-bit for indicating if the matched information is found. If not, it indicates that there is no hit. If yes, it outputs the encoded match result as the index for searching the information table.

Figure 10A:
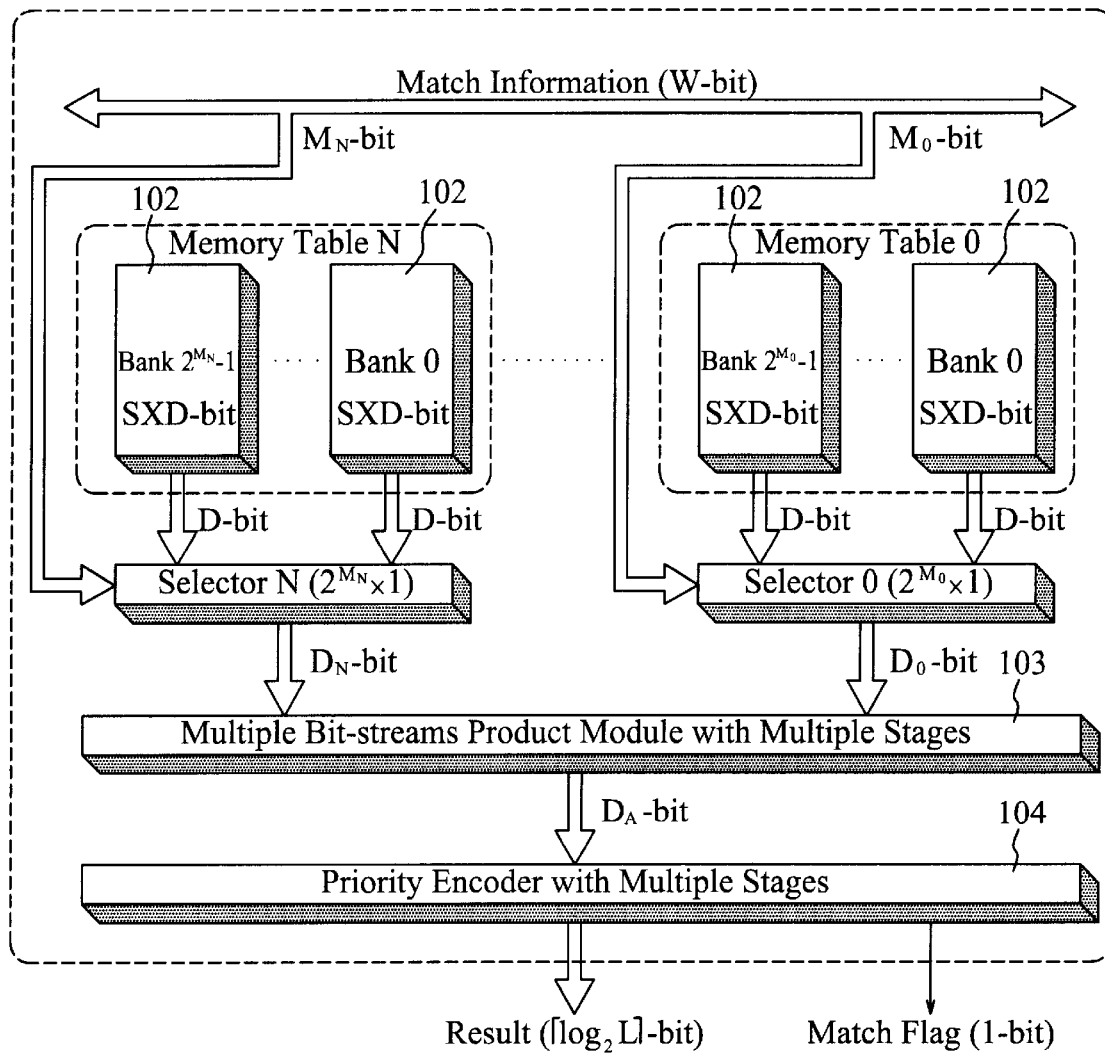
FIG. 10A is a schematic diagram showing the simplified bit-stream ternary match scheme according to another preferred embodiment of the present invention following the pipeline architecture for the concern of cost and performance.

The embodiment of the present invention can be further improved according to the pipeline technology for the concern of cost, performance, and power consumption. The operation steps can be further divided to increase the throughput and reduce the power consumption. With reference to FIG. 10A, it shows a schematic design following the pipeline technology. Thus, the output of all the memory banks 102 can be devided into S stages. Each stage outputs D-bit information. The relationship between the bit-length (D) of each stage and the bit-length (L) of the match information must comply with the following equations: $S \times D = L$, $D = 2^d$, and $D_0 = \ldots = D_N = D_A = D$, $(d \geq 0)$.

Figure 10B:
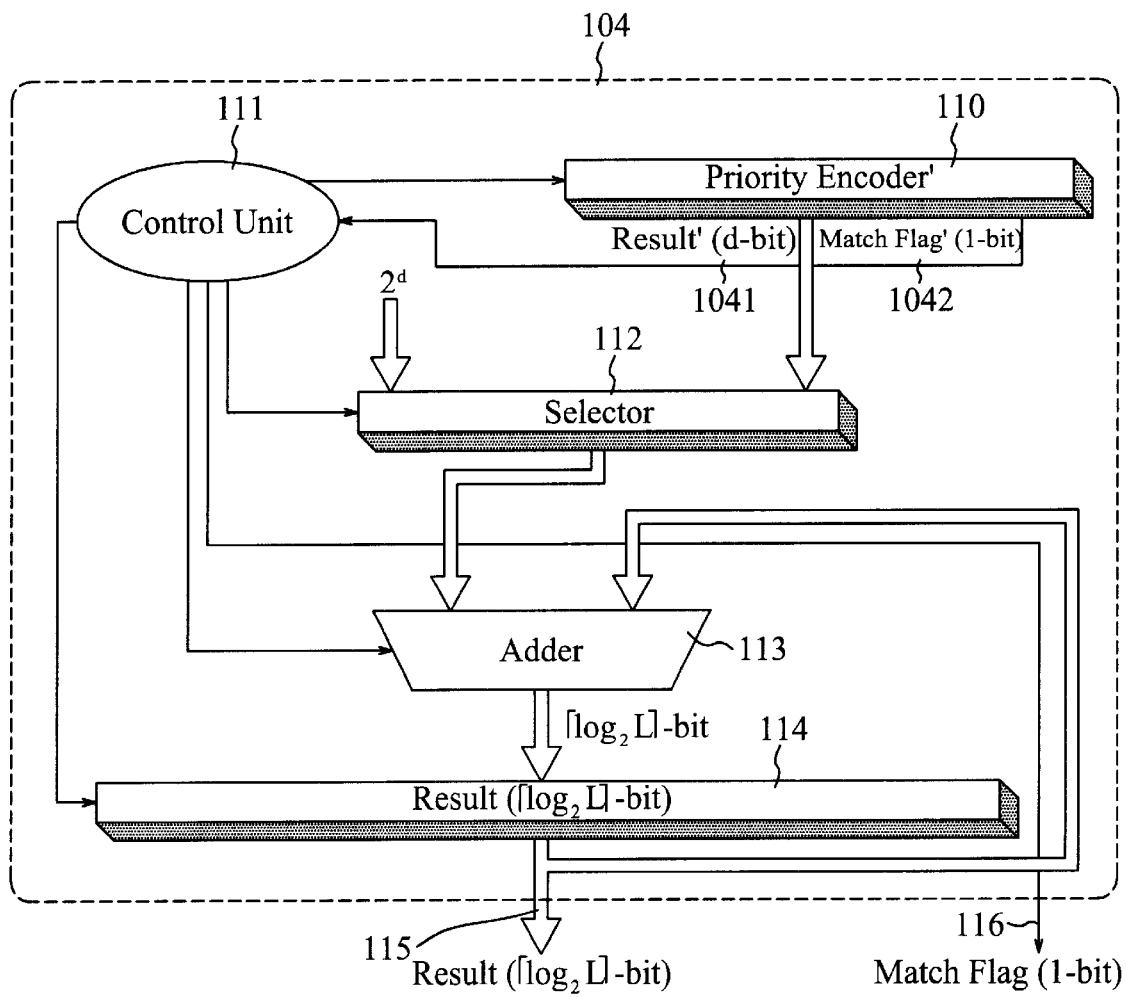
FIG. 10B is a schematic diagram showing the structure of the Priority Encoder of FIG. 10A.

Accordingly, the priority encoder has been modified to be a priority encoder with multiple stages 104. With reference to FIG. 10B, it shows the schematic design of the priority encoder with multiple stages 104 which is designed according to the pipeline structure of S stages. Refer to FIGS. 10A and 10B, the bit-length of the input of the priority encoder with multiple stages 104 becomes D-bit. The output of the priority encoder with multiple stages 104 will include a temporary encoded result (Result') 1041 of d-bit and a temporary match flag (Match Flag') 1042 with 1-bit. The match flag 1042 will be sent to a control unit 111 for controlling each element in the priority encoder with multiple stages 104, such as priority encoder 110, selector 112, adder 113 and buffer for storing the result of $\lceil \log_2 L \rceil$-bit 114. Thus, according to the design of FIG. 10B, the priority encoder with multiple stages 104 can generate a match result 115 of $\lceil \log_2 L \rceil$-bit and a match flag of 1-bit 116.

Figure 10C:
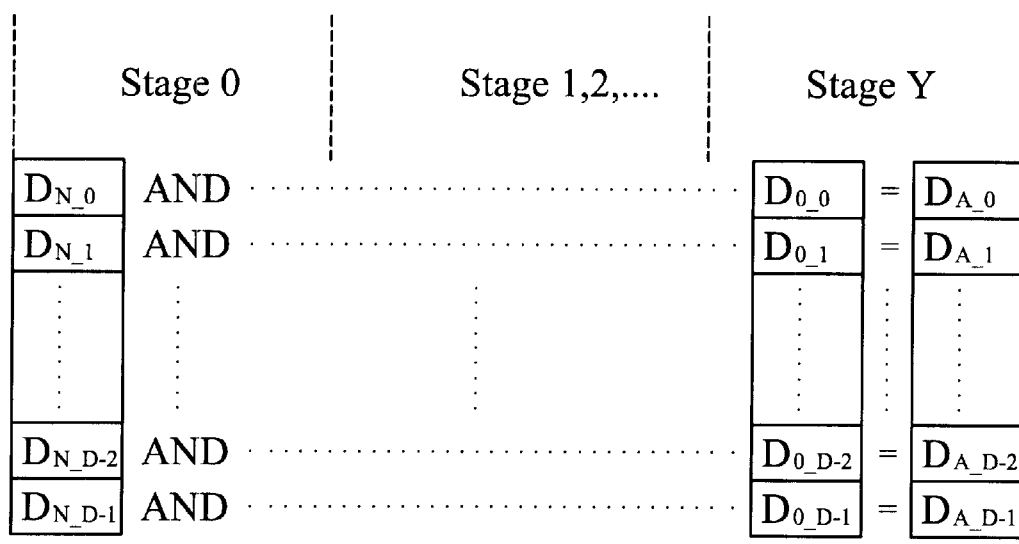
FIG. 10C is a schematic diagram showing the structure of the Product Module of FIG. 10C.

Moreover, to reduce the power consumption, the multiple bit-streams product module can also be divided into multiple stages as illustrated in FIG. 10C. Refer to FIG. 10C, the multiple bit-streams product module with multiple stages 103 has been divided into Y+1 stages. According to the designs of FIGS. 10A~10C, the parameters of each device are closely related to one another. Once the control is improperly operated, the timing sequence of each device will be hardly functioned concurrently and thus cause an error. For this reason, the concurrent issues should be handled carefully when adjusting each parameter. The design as illustrated in FIGS. 10A~FIG. 10C are only for the purpose of illustration. These descriptions are not intended to be construed in a limiting sense.

To sum up, the present invention provides a flexible and ultra high-speed bit-stream ternary match scheme for digital information lookup. It can provide a "Don't care bit" for match in the current digital information system. The method of the present invention includes the steps of:

(a) Determine the required bit-length W for the predetermined rules;
(b) Determine the maximum allowable number (L) of rules;
(c) Divide the bit-length W into N+1 sub-bit-streams, the ith sub-bit-stream (represented by $MS_i$) having a bit-length of $M_i$-bit and $$W = \sum_{i=N}^{0} M_i,$$

($0 \leq i \leq N$, $1 \leq M_i \leq W$), where N is a nonnegative integer.

(d) Determine N+1 memory tables according to the divisional result of the step (c). The ith memory table includes $2^{M^i}$ memory banks, and each memory bank includes bit-streams of L-Bit.
(e) When storing a rule into the jth position of the rule table ($0 \leq j \leq L-1$), it is actually dividing the ternary bit-stream ($W_j$) represented as a rule according to step (c). The result represented by $MS_{ij}$ is converted into the bit-stream ($MBS_{ij}$) for storing into the jth position of each memory bank of the ith memory table $MT_i$ via the pre-computation process. Moreover, the bit-length of the bit-stream ($MBS_{ij}$) is equal to the number of the memory banks in the ith memory table.
(f) Repeat the step (e) to update the rule table if needed.
(g) According to the divisional result of step (c), it requires N+1 selectors. The ith selector ($Sel_i$) and the ith memory table ($MT_i$) are connected together in one-to-one correspondence. Thus, the output of the kth memory bank ($MB_{ik}$) in the ith memory table ($MT_i$) is the kth input of the ith selector ($Sel_i$), where $0 \leq k \leq 2^{M^i}-1$. Accordingly, the ith selector ($Sel_i$) includes input of $2^{M^i}$ items, one output and the select signal of $M_i$ bits.
(h) According to the result of step (g), the outputs of all the selectors are forwarded to a product module for generating the unencoded match result. Thus, the product module includes N+1 inputs and 1 output data.
(i) According to the result of step (h), the output of the product module is input to the priority encoder to perform priority encoding for the match information. Thus, the output of the priority encoder includes a match result of $\lceil \log_2 L \rceil$-bit and a match flag of 1-bit for indicating if the match information has a hit. If the match result is negative, it indicates that there is no hit. If yes, the encoded match result will act as the index for search the information table.

According to the concern of cost, performance and power consumption, the present invention can be more flexible to divide the execution steps into several stages. Thus, the invention can advantageously provide flexibility, high speed and reduce the power consumption by improving the throughput using the pipeline technology.

According to the method mentioned above, the apparatus of the present invention includes: multiple memory tables and equal number of corresponding selectors, a product module, and a priority encoder. Each memory table includes multiple memory banks. After the match information is input, it is divided into several sub-bit-streams. Then, each sub-bit-stream is input to the corresponding selector. From the correspondent memory table, each selector obtains the content of the memory bank selected according to the selection of each sub-bit-stream. The content of each memory bank is the bit-streams pre-computed and then stored in each memory bank. Then, input all the bit-streams output from all the selectors to the product module to generate a bit-stream. Finally, the bit-stream outputting from the product module is input to the priority encoder. After the priority encoding, the match result can be obtained. If the match result is negative, it indicates that there is no match. If the result is affirmative, the index for looking up the match information corresponding to the matching bit-stream can be obtained. Thus, the present invention can obtain the match result in a very short period of time and then use the index to look up the information.

Moreover, the present invention can flexibly adjust the parameters according to the concern of cost, performance, and power consumption etc. Therefore, the present invention is a flexible, and ultra high-speed bit-stream ternary match scheme for information lookup.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A bit-stream ternary match scheme for searching an information table according to a match result of a rule table comprising the steps of:
    (a) determining the space of said rule table according to a maximum allowable bit-length (W) of a rule, and the number of maximum allowable rules (L);
    (b) dividing said maximum allowable bit-length (W) into N+1 sub-bit-streams, where N is a nonnegative integer;
    (c) determining N+1 memory table and N+1 selectors according to the number of sub-bit-streams of said step (b);
    (d) encoding a plurality of rules according to a pre-computation procedure and generating a plurality of encoded entries;
    (e) sequentially storing said plurality of encoded entries in said memory tables;
    (f-1) dividing to-be-matched information of bit-length (W) into N+1 to-be-matched sub-bit-streams, where N is a nonnegative integer;
    (f-2) inputting each of said to-be-matched sub-bit-streams to each of said N+1 selectors respectively, so that each of said N+1 selectors directly selects an output from said encoded entries in each of said memory tables according to each to-be-matched sub-bit-stream, and then sending the output of each of said N+1 selectors into a product module to compute an unencoded match result;
    (g) forwarding said unencoded match result of said product module to a priority encoder to perform priority encoding for generating an encoded match result and a match flag; and
    (h) determining if there is a hit for said match information according to said match flag;
        wherein when said match flag indicating a negative result, there is no match between said match information and said rule table; and when said match flag indicating a positive result, said encoded match result acts as an index for searching said information table.

2. The method as claimed in claim 1, further comprising the step of:
    updating said plurality of encoded entries of said step (d) for said rule table by dating said pre-computation procedure.

3. The method as claimed in claim 1, wherein said step (d) comprises the steps of:

dividing a rule stored in position of said rule table into a plurality of sub-bit-streams ($MS_{ij}$); and converting each of said sub-bit-stream ($MS_{ij}$) into a corresponding bit-stream ($MBS_{ij}$) adaptable for storing into a position j of each memory bank of each ith memory table ($MT_i$) according to said pre-computation procedure, where the bit-length of said bit-stream ($MBS_{ij}$) in said ith memory table is equal to $2^{M_i}$-bit, and said i and j are integer and $0 \leq i \leq N$, $0 \leq j \leq L-1$.

4. The method as claimed in claim 1, wherein the length of the ith sub-bit-stream ($MS_i$) of said step (b) has a length of $M_i$-bit and $$W = \sum_{i=N}^{0} M_i,$$

($0 \leq i \leq N$, $1 \leq M_i \leq W$).

5. The method as claimed in claim 4, wherein the value of said length $M_i$ is adjustable according to desirable performance and cost.

6. The method as claimed in claim 3, wherein said ith memory table contains $2^{M_i}$ memory banks, and each of said memory banks contains a bit-stream with the length of L-bit.

7. The method as claimed in claim 1, wherein said encoded match result of said step (g) comprises:

said match result with the length of $\lceil \log_2 L \rceil$-bit, and said match flag with the length of 1-bit.

8. The method as claimed in claim 1, further comprising the step of.

dividing the output of each of said memory banks into a plurality of stages (S), each of said plurality of stages (S) outputs a bit-stream of D-bit.

9. The method as claimed in claim 8, wherein the number of said stages (S) and said bit-stream of D-bit has a relationship defined by:

$$S \times D = L, \text{ and } D = 2^d, (d \geq 0).$$

* * * * *